US012701727B2

(12) United States Patent
Tzou et al.

(10) Patent No.: US 12,701,727 B2
(45) Date of Patent: Aug. 4, 2026

(54) SEMICONDUCTOR STRUCTURE AND METHOD FOR FORMING THE SAME

(71) Applicant: Vanguard International Semiconductor Corporation, Hsinchu (TW)

(72) Inventors: Chen-Dong Tzou, Taipei City (TW); Yun-Kai Lai, Taichung City (TW); Chih-Cherng Liao, Zhudong Township (TW); Chia-Hao Lee, Zhubei City (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 538 days.

(21) Appl. No.: 18/166,712

(22) Filed: Feb. 9, 2023

(65) Prior Publication Data

US 2024/0274726 A1     Aug. 15, 2024

(51) Int. Cl.
    *H10D 8/60*        (2025.01)
    *H10D 8/01*        (2025.01)

(52) U.S. Cl.
    CPC ............... *H10D 8/60* (2025.01); *H10D 8/051* (2025.01)

(58) Field of Classification Search
    CPC ........ H10D 8/60; H10D 8/051; H10D 62/106; H10D 62/115; H10D 62/117
    See application file for complete search history.

(56) References Cited

U.S. PATENT DOCUMENTS

| | | | | | |
|---|---|---|---|---|---|
| 5,365,102 | A | * | 11/1994 | Mehrotra | H10D 8/605 |
| | | | | | 257/E29.338 |
| 11,881,512 | B2 | * | 1/2024 | Siemieniec | H10D 62/8325 |
| 2007/0210401 | A1 | | 9/2007 | Sanfilippo et al. | |
| 2011/0312161 | A1 | * | 12/2011 | Hamano | H10D 30/66 |
| | | | | | 257/E21.09 |
| 2012/0112266 | A1 | * | 5/2012 | Tarui | H10D 30/66 |
| | | | | | 257/329 |

(Continued)

FOREIGN PATENT DOCUMENTS

| | | | | | |
|---|---|---|---|---|---|
| CN | 112909076 | A | * | 6/2021 | ......... H10D 62/8503 |
| CN | 113193053 | A | | 7/2021 | |

OTHER PUBLICATIONS

Taiwanese Office Action and Search Report dated Sep. 11, 2023 for Application No. 111146521.

*Primary Examiner* — Steven H Loke
*Assistant Examiner* — Khatib A Rahman
(74) *Attorney, Agent, or Firm* — Birch, Stewart, Kolasch & Birch, LLP

(57) ABSTRACT

A semiconductor structure is provided. The semiconductor structure includes a substrate, an epitaxial layer, a well region, an insulating structure, an upper electrode layer, and a lower electrode layer. The substrate has the first conductivity type. The epitaxial layer is disposed on the substrate and has the first conductivity type. There is a protruding structure on the upper portion of the epitaxial layer. The well region is disposed in the epitaxial layer. The well region has the second conductivity type. The insulating structure is disposed on the sidewall of the protruding structure. The upper electrode layer surrounds the protruding structure and is electrically connected to the epitaxial layer and the well region. The lower electrode layer is disposed under the substrate and opposite to the epitaxial layer.

15 Claims, 5 Drawing Sheets

<u>10</u>

(56)                References Cited

U.S. PATENT DOCUMENTS

2018/0350982 A1*  12/2018  Shikauchi ............ H10D 62/106
2022/0069084 A1*   3/2022  Ha ....................... H10D 30/668
2022/0109070 A1*   4/2022  Ono ..................... H10D 30/63
2022/0262916 A1*   8/2022  Shimizu ............. H10D 30/0291

* cited by examiner

10

102P 108
106
104
102E
102E
102
100
110

20

102P 108
104
102
100
110

10

SEMICONDUCTOR STRUCTURE AND METHOD FOR FORMING THE SAME

BACKGROUND

Technical Field

The present disclosure relates to semiconductor structure and method for forming the same, and in particular it relates to a semiconductor structure that includes an insulating structure and a method for forming the same.

Description of the Related Art

In recent years, the semiconductor industry has made significant progress in the development of power devices. Currently, power devices such as high voltage metal-oxide-semiconductor (HVMOS) transistors, insulated gate bipolar transistors (IGBTs), junction field effect transistors (JFETs), and Schottky barrier diodes (SBDs) have been developed. These devices are usually used in various applications such as power amplification and power control in the power systems of household appliances, communication equipment, and automobile generators.

Among the above devices, the Schottky barrier diode has the characteristics of high-speed switching (high-switching) and the ability to withstand a high voltage of hundreds of volts. In order to improve the performance of the Schottky barrier diodes, such as increasing their breakdown voltage and reducing their leakage current, a device has been developed that combines these Schottky diodes with PN diodes. This device is called a junction barrier Schottky (JBS) diode. However, although the junction barrier Schottky diode can reduce the surface electric field and reduce the leakage current by having a PN junction, it has a higher on-resistance and the switching speed is slower than the Schottky barrier diode.

Therefore, trenches may also be disposed on both sides of the Schottky junction to form a trench junction barrier Schottky (TJBS) diode. The trench junction barrier Schottky diode includes a mesa-shaped semiconductor layer between the trench structures, thereby reducing the surface electric field at the Schottky junction and reducing leakage current. However, with the formation of the mesa-shaped semiconductor layer, the on-resistance of the entire device also increases due to the increase in the thickness of the semiconductor layer.

To sum up, although the existing Schottky barrier diodes can generally meet their originally intended purposes, they still do not fully meet the requirements in various respects. For example, finding a way to manufacture Schottky barrier diodes with lower starting resistance while reducing the generation of leakage current is still a research topic in the industry. Therefore, the research and development of power devices requires continuous updates and adjustments to solve various problems faced by power devices during operation.

BRIEF SUMMARY

The present disclosure provides a semiconductor structure. The semiconductor structure includes a substrate, an epitaxial layer, a well region, an insulating structure, an upper electrode layer, and a lower electrode layer. The substrate has a first conductivity type. The epitaxial layer is disposed on the substrate and has the first conductivity type. There is a protruding structure on an upper portion of the epitaxial layer. The well region is disposed in the epitaxial layer. The well region has a second conductivity type. The insulating structure is disposed on the sidewall of the protruding structure. The upper electrode layer surrounds the protruding structure and is electrically connected to the epitaxial layer and the well region. The lower electrode layer is disposed under the substrate and opposite to the epitaxial layer.

The present disclosure provides a method for forming a semiconductor structure. The method includes depositing an epitaxial layer with the first conductivity type on a substrate having the first conductivity type. The method further includes forming a well region with the second conductivity type in the epitaxial layer. The method further includes performing a patterning process to form a protruding structure on the upper portion of the epitaxial layer. The method further includes forming an insulating structure on a sidewall of the protruding structure. The method further includes forming an upper electrode layer surrounding the protruding structure. The upper electrode layer is electrically connected to the epitaxial layer and the well region. The method further includes forming a lower electrode layer opposite to the epitaxial layer on the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion

DETAILED DESCRIPTION

Figure 1:
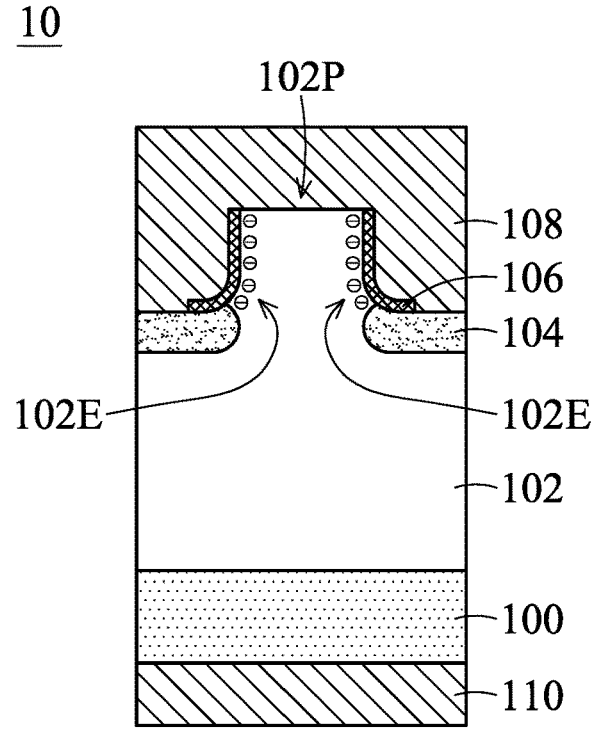
FIG. 1 illustrates a cross-sectional view of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately", and "substantially" used herein generally refer to a given value or a range within 20 percent, preferably within 10 percent, and more preferably within 5 percent, within 3 percent, within 2 percent, within 1 percent, or within 0.5 percent. It should be noted that the amounts provided in the specification are approximate amounts, which means that even "about", "approximate", or "substantially" are not specified, the meanings of "about", "approximate", or "substantially" are still implied.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The term "substantially" is used herein to indicate that the value of a given quantity may vary based on the particular technology node associated with the target semiconductor device. In some embodiments, the term "substantially" may indicate that a value of a given quantity is, for example, within a range of ±5% of a target (or expected) value based on a specific technology node.

The present disclosure provides a semiconductor structure and a method for forming the same, wherein a metal-insulator-semiconductor (MIS) structure is embedded in a trench junction barrier Schottky (TJBS) diode, thereby forming a field-effect accumulation layer of carriers during conduction. In addition, the upper electrode layer of the semiconductor structure is electrically connected to the well region between the protruding structures of the semiconductor epitaxial layer (e.g., the bottom of the trench), and an ohmic contact is formed at the interface between the upper electrode layer and the well region. As a result, the semiconductor structure of the present disclosure has a breakdown voltage comparable to that of conventional junction barrier Schottky diodes or trench junction barrier Schottky diodes, and has various electrical improvements. For example, the semiconductor structure of the present disclosure can have a smaller leakage current than the conventional junction barrier Schottky diode, and can have a lower on-resistance compared with the conventional trench type junction barrier Schottky diode. In addition, the semiconductor structure of the present disclosure has better reverse recovery properties, which can reduce power loss and heat generation of the diode during the process from the on state to the complete off state of the diode, which is beneficial to applications under high frequencies.

FIG. 1 illustrates a cross-sectional view of a semiconductor structure, in accordance with some embodiments of the present disclosure. A semiconductor structure 10 may include a substrate 100, an epitaxial layer 102, a well region 104, an insulating structure 106, an upper electrode layer 108, and a lower electrode layer 110. The substrate 100 may have the first conductivity type (e.g., n-type). The epitaxial layer 102 may be disposed on the substrate 100 and has the first conductivity type, and there is a protruding structure 102P on the upper portion of the epitaxial layer 102. The well region 104 may be disposed in the epitaxial layer 102, and the well region 104 has the second conductivity type (e.g., p-type) opposite to the first conductivity type. The insulating structure 106 may be disposed on a sidewall of the protruding structure 102P. The upper electrode layer 108 may surround the protruding structure 102P, and the upper electrode layer 108 is electrically connected to the epitaxial layer 102 and the well region 104. The lower electrode layer 110 may be disposed under the substrate 100 and opposite to the epitaxial layer 102.

In some embodiments, the substrate 100 is a bulk semiconductor substrate, such as a semiconductor wafer. In some embodiments, the substrate 100 is formed of silicon, germanium, other suitable semiconductor materials, or combinations thereof. For example, in a particular embodiment, the substrate 100 includes silicon. In some embodiments, the substrate 100 may include compound semiconductors, such as silicon carbide, gallium nitride, gallium oxide, gallium arsenide, other suitable semiconductor materials, or combinations thereof. In some embodiments, the substrate 100 may include alloy semiconductors, such as silicon germanium, silicon germanium carbide, other suitable materials, or combinations thereof. In some embodiments, the substrate 100 may include multi-layer materials, such as multi-layer materials including silicon/silicon germanium, silicon/silicon carbide.

In some embodiments of the present disclosure, for example, the substrate 100 is a wafer doped with a dopant of the first conductivity type, which is n-type. In some other embodiments, the first conductivity type may also be p-type. In cases where the first conductivity type is n-type, the dopant with the first conductivity type may be, for example, nitrogen, phosphorus, arsenic, antimony, bismuth, or silicon. In some embodiments, the doping concentration of the substrate 100 is between about 1E19 atoms/cm$^3$ and about 1E21 atoms/cm$^3$.

The epitaxial layer 102 may include the same or similar material as the substrate 100, such as silicon, germanium, silicon carbide, gallium nitride, gallium oxide, gallium arsenide, silicon germanium, silicon germanium carbide, other suitable materials, or combinations thereof. In some embodiments, the substrate 100 and the epitaxial layer 102 have the same conductivity type (e.g., n-type), and the substrate 100 and the epitaxial layer 102 may include the same dopant. In some embodiments, the doping concentration of the aforementioned dopant in the epitaxial layer 102 is smaller than that in the substrate 100. In some embodiments, the doping concentration of the epitaxial layer 102 is between about 1E13 atoms/cm$^3$ and about 1E18 atoms/cm$^3$. In some embodiments of the present disclosure, for example, the epitaxial layer 102 includes silicon carbide. By forming the epitaxial layer 102 with silicon carbide, the epitaxial layer 102 can be doped with dopants suitable for the energy band range of silicon carbide and having lower activation energy. In addition, the epitaxial layer 102 formed of silicon carbide can provide higher breakdown voltage, lower leakage current, and lower on-resistance.

Continuing to refer to FIG. 1, the well region 104 may include the same or similar materials as the substrate 100, such as silicon, germanium, silicon carbide, gallium nitride, gallium oxide, gallium arsenide, silicon germanium, silicon germanium carbide, other suitable materials, or a combination thereof. In some embodiments, the substrate 100 has a different conductivity type than the epitaxial layer 102. In some embodiments of the present disclosure, for example, the well region 104 is doped with the second conductivity type, which is p-type. In cases where the second conductivity type is p-type, the dopant with the second conductivity type may be, for example, boron, aluminum, gallium, indium, thallium, magnesium. In some embodiments, the doping concentration of the well region 104 ranges from about 1E16 atoms/cm³ to about 1E18 atoms/cm³.

It should be noted that the protruding structure 102P is defined as a portion of the epitaxial layer 102 protruding above a top surface of the well region 104 in the present disclosure. In some embodiments, as shown in FIG. 1, the insulating structure 106 disposed on the sidewall of the protruding structure 102P extends to overlap a portion of the top surface of the well region 104. As shown in FIG. 1, the insulating structure 106 may expose the top surface of the protruding structure 102P. In some embodiments, the insulating structure 106 does not vertically overlap the top surface of the protruding structure 102P, and the top portion of the insulating structure 106 is substantially flush with the top surface of the protruding structure 102P.

As shown in FIG. 1, the insulating structure 106 may be located between the protruding structure 102P and the upper electrode layer 108. In some embodiments, near the sidewall of the protruding structure 102P, the epitaxial layer 102, the insulating structure 106, and the upper electrode layer 108 may form a metal-insulator-semiconductor (MIS) structure. As a result, a field effect accumulation layer 102E of carriers can be formed to reduce the starting resistance of the semiconductor structure 10 when the semiconductor structure 10 is turned on, as will be discussed in the following.

The material of the insulating structure 106 may include silicon oxide, hafnium oxide, zirconium oxide, aluminum oxide, aluminum oxide-hafnium alloy, silicon dioxide-hafnium, silicon hafnium oxynitride, tantalum hafnium oxide, titanium hafnium oxide, zirconium hafnium oxide, other suitable high-k dielectric materials, or a combination thereof. In some embodiments, insulating structure 106 includes an oxide having an element in common with epitaxial layer 102. For example, in a particular embodiment, epitaxial layer 102 includes silicon or silicon carbide, and the insulating structure 106 includes silicon oxide.

Continuing to refer to FIG. 1, in some embodiments, there is a trench structure surrounding the protruding structure 102P on the upper portion of the epitaxial layer 102, and the upper electrode layer 108 is filled in the trench structure. In some embodiments, as shown in FIG. 1, a portion of the insulating structure 106 extends between the well region 104 and the upper electrode layer 108.

By disposing the upper electrode layer 108 on the well region 104 and around the protruding structure 102P, an ohmic contact can be formed between the upper electrode layer 108 and the well region 104, and a Schottky contact can be formed between the upper electrode layer 108 and the top surface of the protruding structure 102P. As a result, the Schottky contact can be used to reduce the voltage drop and have a faster response speed while using the well region 104 to reduce the leakage of the semiconductor structure 10. In addition, although not shown in FIG. 1, in some embodiments, the semiconductor structure 10 further includes a silicide layer at the interface between the well region 104 and the upper electrode layer 108, thereby improving the Ohmic contact properties between the upper electrode layer 108 and the well region 104.

The upper electrode layer 108 may be or include, for example, platinum (Pt), titanium (Ti), titanium nitride (TiN), tantalum (Ta), tantalum nitride (TaN), tungsten (W), tungsten nitride (WN), gold (Au), iron (Fe), nickel (Ni), beryllium (Be), chromium (Cr), cobalt (Co), antimony (Sb), iridium (Ir), molybdenum (Mo), osmium (Os), thorium (Th), vanadium (V), some other metal or metal nitride, or a combination thereof.

The lower electrode layer 110 may be or include the same or similar material as the upper electrode layer 108. For example, the lower electrode layer 110 may be or include, for example, platinum (Pt), titanium (Ti), titanium nitride (TiN), tantalum (Ta), tantalum nitride (TaN), tungsten (W), nitride Tungsten (WN), gold (Au), iron (Fe), nickel (Ni), beryllium (Be), chromium (Cr), cobalt (Co), antimony (Sb), iridium (Ir), molybdenum (Mo), Osmium (Os), Thorium (Th), Vanadium (V), some other metal or metal nitride, or a combination thereof.

The following will discuss the operation principle of the semiconductor structure 10 under the condition that the doping type of the substrate 100 and the epitaxial layer 102 is n-type and the doping type of the well region 104 is p-type. However, in fact, those skilled in the art may also adjust the doping types of the substrate 100, the epitaxial layer 102, and the well region 104 according to design requirements, which is not limited in the present disclosure. When a forward bias is applied to the semiconductor structure 10, the upper electrode 108 disposed around the protruding structure 102P and the lower electrode 110 disposed under the substrate 100 may be used as the anode and the cathode of the trench junction barrier Schottky device, respectively. The electrons generated in the epitaxial layer 102 due to the MIS structure can form the field effect accumulation layer 102E when the semiconductor structure 10 is turned on in forward operation, thereby reducing the starting resistance of the semiconductor structure 10. In addition, the MIS structure can reduce leakage current through the generation of depletion regions during reverse operation.

Figure 2:
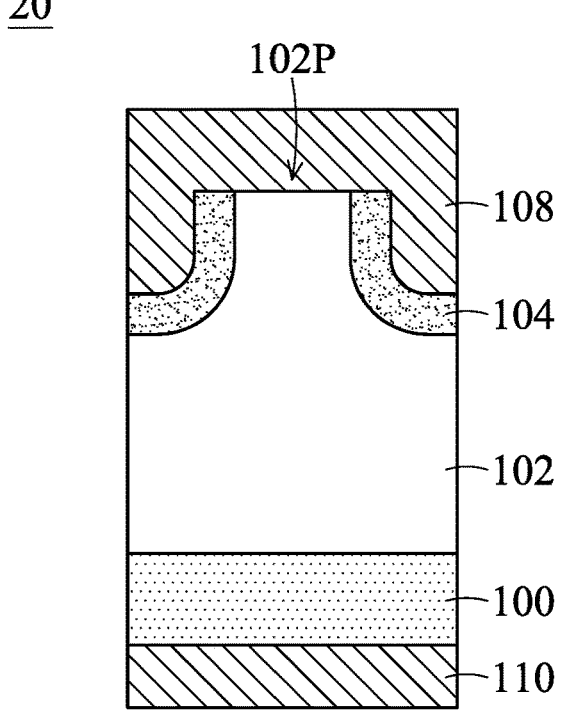
FIG. 2 illustrates a cross-sectional view of a conventional trench junction barrier Schottky diode.

Referring to a conventional trench junction barrier Schottky (TJBS) diode 20 in FIG. 2, the difference from the semiconductor structure 10 of the present disclosure is that the well region 104 of the conventional trench junction barrier Schottky diode 20 further extends to the sidewall of the protruding structure 102P, and there is no insulating structure between the protruding structure 102P and the upper electrode layer 108. When the conventional trench junction barrier Schottky diode 20 operates, since the epitaxial layer 102 has the protruding structure 102P, the surface electric field of the epitaxial layer 102 adjacent to the upper electrode layer 108 is reduced, which can reduce leakage current, compared with the conventional junction barrier Schottky diode. However, the existence of the protruding structure 102P also leads to an increase in the total resistance of the current flow in the epitaxial layer 102 (especially the part of the resistance from the protruding structure 102P), so that the conventional trench junction barrier Schottky diode 20 has a higher starting resistance.

In contrast, the semiconductor structure 10 of the present disclosure has an MIS structure formed by the epitaxial layer 102, the insulating structure 106, and the upper electrode layer 108. The field effect accumulation layer 102E formed when the semiconductor structure 10 is turned on can reduce the starting resistance of the semiconductor structure 10 while reducing the leakage current. In addition, the semiconductor structure 10 of the present disclosure has a breakdown voltage comparable to conventional junction barrier Schottky diodes and trench junction barrier Schottky diodes. Therefore, the semiconductor structure 10 of the present disclosure can provide lower leakage current and lower starting resistance simultaneously under normal voltage conditions (for example, there is a bias voltage of 600V~1200V between the upper electrode layer 108 and the lower electrode layer 110).

Furthermore, compared to the conventional trench junction barrier Schottky (TJBS) diode 20 in FIG. 2, since the semiconductor structure 10 of the present disclosure has the MIS structure, the contact area of metal and the well region 104 and the surface area of the well region 104 can be reduced, which can make the reverse recovery of the semiconductor structure 10 faster. Therefore, the semiconductor structure 10 of the present disclosure can have better reverse recovery properties when turned off, such as having a shorter recovery time. As a result, the semiconductor structure 10 can reduce power loss and heat generation of the diode when the diode is turned from the on state to the complete off state, which is beneficial for applications at high frequencies.

FIGS. 3A-3G illustrate cross-sectional views of various stages of a method for forming a semiconductor structure 10, in accordance with some embodiments of the present disclosure. Although FIGS. 3A-3G are described with reference to a method, it should be understood that the structures shown in FIGS. 3A-3G are not limited to this method, but can be independent of this method.

Figure 3A:
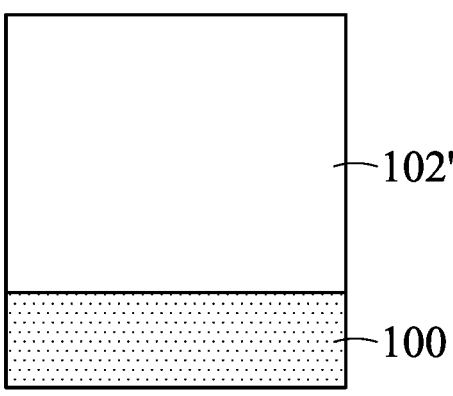
FIGS. 3A-3G illustrate cross-sectional views of various stages of a method for forming a semiconductor structure, in accordance with some embodiments of the present disclosure.

As shown in FIG. 3A, an epitaxial layer 102' of the first conductivity type may be deposited on a substrate 100 with the first conductivity type (for example, n-type). The epitaxial layer 102' may include the same or similar material as the substrate 100, such as silicon, germanium, silicon carbide, gallium nitride, gallium oxide, gallium arsenide, silicon germanium, silicon germanium carbide, other suitable materials, or a combination thereof. In some embodiments of the present disclosure, for example, the epitaxial layer 102' includes silicon carbide. By forming the epitaxial layer 102' with silicon carbide, the epitaxial layer 102' can be doped with dopants suitable for the energy band range of silicon carbide and having lower activation energy.

The epitaxial layer 102' may be deposited by the following processes, such as chemical vapor deposition (CVD), physical vapor deposition (PVD), atomic layer deposition (ALD), pulsed laser deposition (PLD), some other deposition processes, or a combination thereof.

In some embodiments, the epitaxial layer 102' is doped in-situ to have the first conductivity type (e.g., n-type). In some other embodiments, the epitaxial layer 102' is doped with dopants having the first conductivity type after the deposition of the epitaxial layer 102'. For example, the epitaxial layer 102' may be doped by ion implantation, thermal diffusion, other suitable processes, or a combination thereof. The doped epitaxial layer 102' may have the same first conductivity type as the substrate 100, and the dopant concentration in the epitaxial layer 102' is smaller than that in the substrate 100.

Figure 3B:
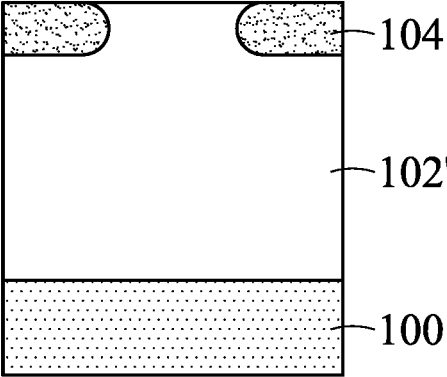
Figure 3C:
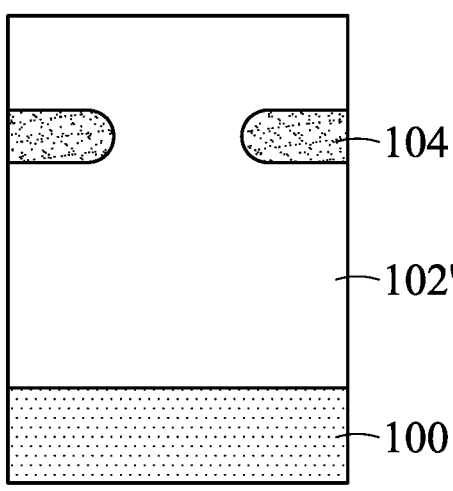
Figure 3D:
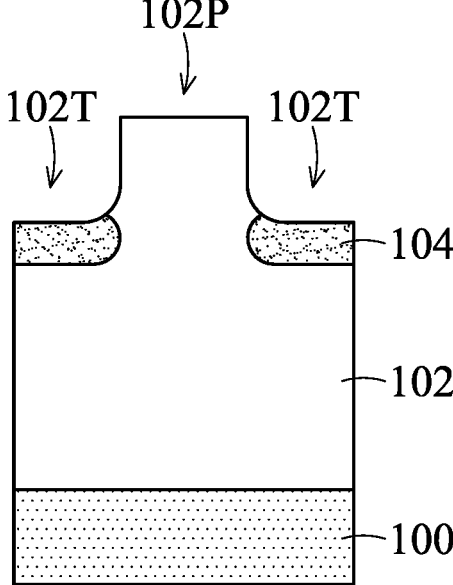

Next, referring to FIGS. 3B-3D, a well region 104 with the second conductivity type (e.g., p-type) may be formed in the epitaxial layer 102', and a patterning process may be performed to form a protruding structure 102P on the upper portion of an epitaxial layer 102. In some embodiments, the well region 104 is buried in the epitaxial layer 102' before the patterning process of the epitaxial layer 102' and is exposed from the upper portion of the epitaxial layer 102 after the patterning process, as discussed below with reference to FIGS. 3B-3D.

Referring to FIG. 3B, the well region 104 having the second conductivity type may be formed to have portions separated from each other on the upper portion of the epitaxial layer 102'. Formation of the well region 104 may include forming a patterned masking layer (not shown) (e.g., positive/negative photoresist, hard mask, etc.) over the epitaxial layer 102'. The patterned masking layer may be formed by forming a masking layer (not shown) on the epitaxial layer 102' (e.g., through a spin-coating process), exposing the masking layer to a pattern (e.g., through a lithography process such as photolithography, EUV lithography, etc.), and developing the masking layer. Afterwards, after the patterned masking layer is in place, the unshielded part of the upper portion of the epitaxial layer 102' may be doped by ion implantation, thermal diffusion, other suitable processes, or a combination thereof to form the well region 104. Next, the patterned masking layer may be stripped. The doped well region 104 may have the second conductivity type (e.g., p-type) opposite to the first conductivity type of the epitaxial layer 102'.

Next, referring to FIG. 3C, the epitaxial material may be further deposited to grow the epitaxial layer 102', so that the epitaxial layer 102' covers the well region 104. In the further growth of the epitaxial layer 102', materials and processes similar to those of the epitaxial layer 102' below the top surface of the well region 104 may be used, which will not be further described here.

Next, referring to FIG. 3D, the epitaxial layer 102' may be patterned to form the epitaxial layer 102 having the protruding structure 102P, and a trench structure 102T is formed around the protruding structure 102P. As shown in FIG. 3D, the well region 104 may be exposed at the bottom of the trench structure 102T after the patterning process.

The process for forming the protruding structure 102P and the trench structure 102T includes forming a patterned masking layer (not shown) (e.g., positive/negative photoresist, hard mask, or the like) over the epitaxial layer 102' before being patterned. The patterned masking layer may be formed by forming a masking layer (not shown) on the epitaxial layer 102' (e.g., through a spin-coating process), exposing the masking layer to a pattern (e.g., through a lithography process such as photolithography, EUV lithography, etc.), and developing the masking layer. Afterwards, after the patterned masking layer is in place, an etching process is performed on the epitaxial layer 102' according to the patterned masking layer.

The etching process removes the unshielded portion of the epitaxial layer 102', thereby forming the protruding structure 102P and the trench structure 102T around the protruding structure 102P. In some embodiments, the etching process may be or include, for example, a wet etching process, a dry etching process, a reactive ion etching (RIE) process, other suitable etching processes, or a combination thereof.

Next, the patterned masking layer may be stripped. In some embodiments, the etching process described above is performed until a portion of the well region 104 is also removed. As shown in FIG. 3D, in some embodiments, the top portion of the well region 104 near the protruding structure 102P is higher than the top surface away from the protruding structure 102P. In this way, it can be ensured that there is substantially no remaining epitaxial layer 102' on the top surface of the well region 104.

Although the well region 104 is formed before the patterning process of the epitaxial layer 102' in the embodiments of FIGS. 3B-3D, the present disclosure is not limited thereto. In other embodiments, the well region 104 is formed in the epitaxial layer 102 after the patterning process of the epitaxial layer 102'. In such embodiments, the epitaxial layer 102 is exposed at the bottom of the trench structure 102T after the patterning process described above. Next, the portion of the epitaxial layer 102 exposed at the bottom of the trench structure 102T may be doped with dopants of the second conductivity type to form the well region 104.

The doping method of the dopant with the second conductivity type may include forming a masking layer (not shown) (e.g., positive/negative photoresist, hard mask, etc.) on the top surface and side surfaces of the protruding structure 102P. A patterned masking layer covering only the top surface and side surfaces of the protruding structures 102P may be formed by blanketly (e.g., through a spin-coating process) forming a masking layer (not shown) on the epitaxial layer 102 with the protruding structures 102P, exposing the masking layer to a pattern (e.g., through a lithography process, such as photolithography, lithography, EUV lithography, etc.), and developing the masking layer. This patterned masking layer exposes the epitaxial layer 102 at the bottom of the trench structure 102T.

Afterwards, after the patterned masking layer is in place, a portion of the epitaxial layer 102 at the bottom of the trench structure 102T and unshielded may be doped by ion implantation, thermal diffusion, other suitable processes, or a combination thereof, thereby forming the well region 104. Next, the patterned masking layer may be stripped. The doped well region 104 may have the second conductivity type opposite to the first conductivity type of the epitaxial layer 102.

Figure 3E:
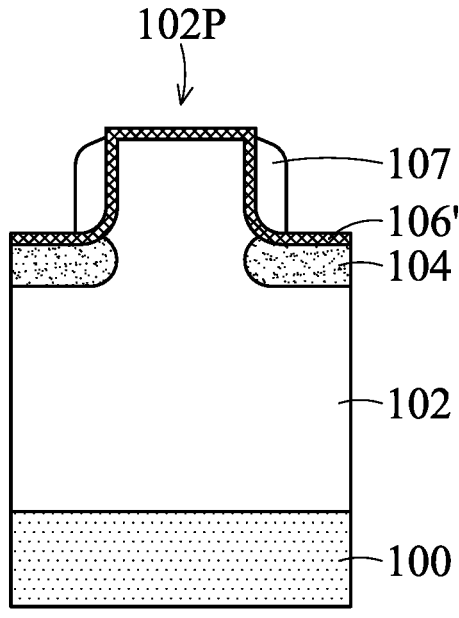
Figure 3F:
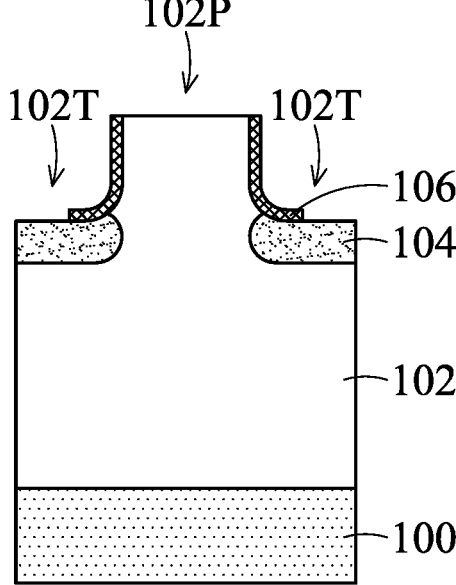

After forming the protruding structure 102P, as shown in FIGS. 3E and 3F, an insulating structure 106 may be formed on a sidewall of the protruding structure 102P. The formation of the insulating structure 106 may include conformally depositing an insulating layer 106' on the protruding structure 102P and the well region 104, and then portions of the insulating layer 106' on the top surfaces of the protruding structure 102P and the well region 104 may be removed.

The material of the insulating layer 106' may include silicon oxide, hafnium oxide, zirconium oxide, aluminum oxide, aluminum oxide hafnium alloy, silicon hafnium oxide, silicon hafnium oxynitride, tantalum hafnium oxide, titanium hafnium oxide, zirconium hafnium oxide, other suitable high-k dielectric materials, or a combination thereof. In some embodiments, the insulating layer 106' includes an oxide having an element in common with the epitaxial layer 102. For example, in a particular embodiment, the epitaxial layer 102 includes silicon or silicon carbide, and the insulating layer 106' includes silicon oxide. The insulating layer 106' may be deposited by, for example, CVD, PVD, ALD, a spin-on process, some other deposition processes, or a combination thereof.

As shown in FIG. 3E, the removal of the above-mentioned portion of the insulating layer 106' may include forming a spacer 107 on the insulating layer 106', thereby preventing the insulating layer 106' covering the portion of the sidewall of the protruding structure 102P from being removed in subsequent etching processes. In some embodiments, the spacer 107 may partially overlap the well region 104 in the vertical direction, thereby forming the insulating structure 106 extending to the top surface of the well region 104. The spacer 107 may include a material having etch selectivity to the insulating layer 106', such as oxide (e.g., $SiO_2$), nitride (e.g., SiN), oxynitride (e.g., SiON), some other dielectric materials, or a combination thereof.

The formation of the spacers 107 may include, for example, a deposition process and a patterning process. The material for spacers 107 may be deposited by, for example, CVD, PVD, ALD, a spin-coating process, some other deposition processes, or a combination thereof. The deposited material for the spacer 107 will cover the protruding structure 102P and the well region 104, and then a patterning process may be performed to form the spacer 107, so that the resulted spacer 107 exposes the insulating layer 106' at the bottom of the trench structure 102T and above the protruding structure 102P.

After the spacer 107 is formed, referring to FIGS. 3E and 3F, an etching process may be performed to remove portions of the insulating layer 106' exposed from the spacer 107, and then the spacer 107 may be removed, thereby forming the insulating structure 106. In some embodiments, the etching process of the insulating layer 106' and the spacer 107 may be or include, for example, a wet etching process, a dry etching process, a reactive ion etching process, other suitable etching processes, or a combination thereof.

Although FIGS. 3E and 3F illustrate the method of forming the insulating structure 106 using the spacer 107, the method of forming the insulating structure 106 of the present disclosure is not limited thereto. In some embodiments, the insulating structure 106 is an oxide formed on the sidewall of the protruding structure 102P by heating and oxidizing the epitaxial layer 102. More specifically, by performing a heat treatment, the material on the surface of the epitaxial layer 102 can be oxidized to form the insulating structure 106 including oxide. Next, part of the insulating structure 106 may be removed to expose the top surface of the protruding structure 102P, so that the epitaxial layer 102 can be electrically connected to the subsequently formed upper electrode layer 108. In some specific embodiments, the epitaxial layer 102 includes silicon-containing materials (such as silicon, silicon germanium, silicon carbide, silicon nitride, silicon oxynitride, silicon oxycarbide, etc.), and the insulating structure includes silicon oxide.

Figure 3G:
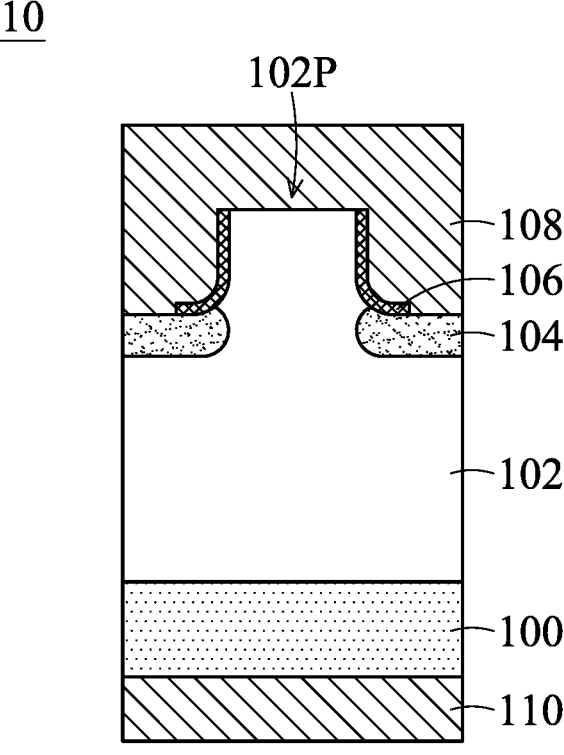

After forming the insulating structure 106, referring to FIG. 3G, an upper electrode layer 108 surrounding the protruding structure 102P may be formed, and the upper electrode layer 108 may be electrically connected to the epitaxial layer 102 and the well region 104. In some embodiments where the well region 104 includes silicon, a heat treatment may be performed to form silicide between the upper electrode layer 108 and the well region 104, thereby improving the ohmic contact properties between the upper electrode layer 108 and the well region 104. The upper electrode layer 108 may be deposited by, for example, ALD, PVD, CVD, sputtering, electrochemical plating, electroless plating, some other deposition processes, or combinations thereof.

Then, the semiconductor structure formed with the upper electrode layer 108 may be flipped, and a lower electrode layer 110 opposite to the epitaxial layer 102 may be formed on the substrate 100. The lower electrode layer 110 may be deposited by, for example, ALD, PVD, CVD, sputtering, electrochemical plating, electroless plating, some other deposition processes, or combinations thereof.

In summary, the present disclosure provides a semiconductor structure and a method for forming the same, wherein a metal-insulator-semiconductor (MIS) structure is embedded in a trench junction barrier Schottky diode, thereby forming a field-effect accumulation layer of carriers during conduction. In addition, the upper electrode layer of the semiconductor structure is electrically connected to the well region between the protruding structures of the semiconductor epitaxial layer (e.g., the bottom of the trench), and an ohmic contact is formed at the interface between the upper electrode layer and the well region. As a result, the semiconductor structure of the present disclosure has a breakdown voltage comparable to that of conventional junction barrier Schottky diodes or trench junction barrier Schottky diodes, and has various electrical improvements. For example, the semiconductor structure of the present disclosure can have a smaller leakage current than the conventional junction barrier Schottky diode, and can have a lower on-resistance compared with the conventional trench type junction barrier Schottky diode. In addition, the semiconductor structure of the present disclosure has better reverse recovery properties, which can reduce power loss and heat generation of the diode during the process from the on state to the complete off state of the diode, which is beneficial to applications under high frequencies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate having a first conductivity type;
an epitaxial layer disposed on the substrate and having the first conductivity type, wherein there is a protruding structure on an upper portion of the epitaxial layer;
a well region disposed in the epitaxial layer, wherein the well region has a second conductivity type;
an insulating structure disposed on a sidewall of the protruding structure, wherein a top portion of the insulating structure is substantially flush with a top surface of the protruding structure;
an upper electrode layer surrounding the protruding structure and electrically connected to the epitaxial layer and the well region, wherein the upper electrode layer is in physical contact with the protruding structure; and
a lower electrode layer disposed under the substrate and opposite to the epitaxial layer.

2. The semiconductor structure as claimed in claim 1, wherein the insulating structure is located between the protruding structure and the upper electrode layer.

3. The semiconductor structure as claimed in claim 1, wherein there is a trench structure surrounding the protruding structure on the upper portion of the epitaxial layer, and the upper electrode layer is filled in the trench structure.

4. The semiconductor structure as claimed in claim 1, wherein a portion of the insulating structure extends between the well region and the upper electrode layer.

5. The semiconductor structure as claimed in claim 1, wherein the epitaxial layer comprises silicon carbide.

6. The semiconductor structure as claimed in claim 1, wherein the substrate comprises silicon or silicon carbide.

7. The semiconductor structure as claimed in claim 1, wherein a dopant concentration in the epitaxial layer is lower than a dopant concentration in the substrate.

8. The semiconductor structure as claimed in claim 1, wherein the insulating structure comprises an oxide having an element in common with the epitaxial layer.

9. The semiconductor structure as claimed in claim 1, further comprising a silicide layer located at an interface between the well region and the upper electrode layer.

10. A method for forming the semiconductor structure as set forth in claim 1, comprising:
depositing the epitaxial layer having the first conductivity type on the substrate having the first conductivity type;
forming the well region having the second conductivity type in the epitaxial layer;
performing a patterning process to form the protruding structure on the upper portion of the epitaxial layer;
forming the insulating structure on the sidewall of the protruding structure, wherein the top portion of the insulating structure is substantially flush with the top surface of the protruding structure;
forming the upper electrode layer surrounding the protruding structure, wherein the upper electrode layer is electrically connected to the epitaxial layer and the well region, wherein the upper electrode layer is in physical contact with the protruding structure; and
forming the lower electrode layer opposite to the epitaxial layer on the substrate.

11. The method as claimed in claim 10, wherein the well region is buried in the epitaxial layer before the patterning process, and the well region is exposed from the upper portion of the epitaxial layer after the patterning process.

12. The method as claimed in claim 10, wherein the well region is formed in the epitaxial layer after the patterning process.

13. The method as claimed in claim 10, wherein forming the insulating structure comprises:
conformally depositing an insulating layer on the protruding structure and the well region; and
removing portions of the insulating layer located on top surfaces of the protruding structure and the well region.

14. The method as claimed in claim 13, wherein removing the portions of the insulating layer comprises:
forming a spacer on the insulating layer;
performing an etching process to remove the portions of the insulating layer exposed from the spacer; and
removing the spacer.

15. The method as claimed in claim 10, wherein the insulating structure is an oxide that is formed on a sidewall of the protruding structure by heating the epitaxial layer.

* * * * *